United States Patent [19]

Dobrovolny

[11] Patent Number: 4,823,400

[45] Date of Patent: Apr. 18, 1989

[54] RADIO FREQUENCY MIXER

[75] Inventor: Pierre Dobrovolny, North Riverside, Ill.

[73] Assignee: Zenith Electronics Corporation, Glenview, Ill.

[21] Appl. No.: 96,683

[22] Filed: Sep. 15, 1987

[51] Int. Cl.⁴ .............................................. H04B 1/26
[52] U.S. Cl. ..................................... 455/326; 455/330
[58] Field of Search ............... 455/325, 326, 327, 328, 455/330, 331, 313; 333/4, 25

[56] References Cited

U.S. PATENT DOCUMENTS

| | | | |
|---|---|---|---|
| 4,152,653 | 5/1979 | Dobrovolny | 325/446 |
| 4,245,355 | 1/1981 | Pascoe et al. | 455/326 |
| 4,371,982 | 2/1983 | Hallford | 455/330 X |

FOREIGN PATENT DOCUMENTS

0169402  12/1981  Japan .................................... 455/330

OTHER PUBLICATIONS

Paul et al.; Conference: "Technology Growth for the 80's", 1980 IEEE MTT-S International, Microwave Symposium Digest, Washington, D.C. (May 28-30, 1980), pp. 274-275.
Hallford; "Simple Balun-Coupled Mixers", 1981 IEEE MTT-S International, Microwave Symposium; Los Angeles, CA. (Jun. 15-19, 1981); pp. 304-306.
Tech. Notes, vol. 8, No. 2, Mar./Apr. 1981, "Mixers: Part 1", pp. 2-15; by the Watkins-Johnson Co.
Tech. Notes, vol. 8, No. 3, May/Jun. 1981, "Mixers: Part 2", pp. 2-19; by the Watkins-Johnson Co.
Tech. Notes, vol. 10, No. 4, Jul./Aug. 1983, "Predicting Intermodulation Suppression . . . ", by Watkins-Johnson Co., pp. 2-15.

Primary Examiner—Robert L. Griffin
Assistant Examiner—Ralph E. Smith

[57] ABSTRACT

An RF mixer combines electrical and structural aspects to create a more efficient device. Diodes are coaxially mounted within two conductive tubes which form shields. The respective diode or diodes associated with each of the tubes are cross-connected at the LO port to the tube associated with the other diode or diodes. A capacitor compensates the inductance associated with the outer surfaces of the tubes. At their other ends, the tubes are coupled to ground and the diodes are coupled to an RF/IF bandsplitting network.

14 Claims, 3 Drawing Sheets

FIG. I (PRIOR ART)
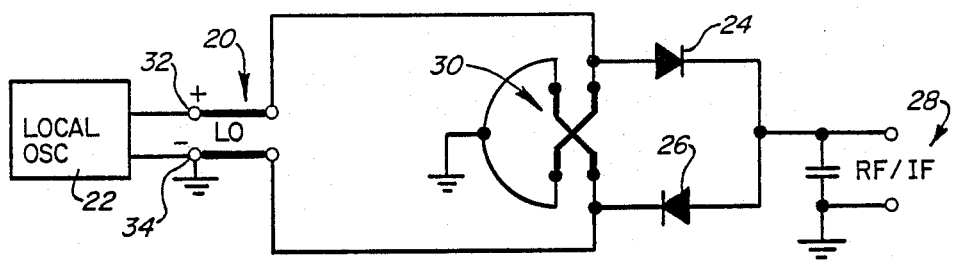
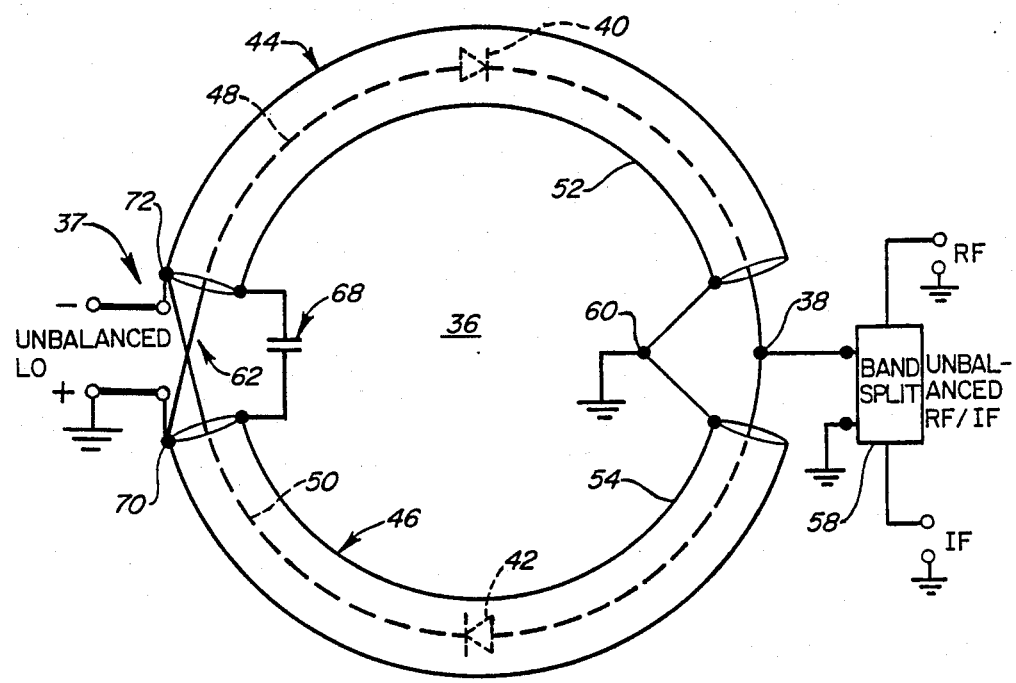
FIG. 2

RADIO FREQUENCY MIXER

BACKGROUND AND PRIOR ART

This invention relates to mixers, and more particularly to high frequency mixers.

Electromagnetic waves in the high frequency band have a characteristic such that the physical dimensions and geometry of circuit hardware is very often as important as and sometimes more important than the electrical circuit configuration. Moreover, at such frequencies optimization of either a physical or an electrical parameter usually occurs at the expense of another parameter. Thus, a blending and combining of hardware and electrical circuit aspects of a radio frequency device becomes a challenge.

The invention provides a high frequency mixer wherein the conversion loss is significantly less than it has been in prior art devices, yet this reduction has been accomplished without adversely effecting other performance characteristics. For example, prior to the invention, a reasonably expected conversion loss for a state-of-the-art cable television (CATV) mixer was in the order of 6–10 dB. The invention has successfully reduced that loss to the 3.5–4.5 dB range, over nearly a full octave of local oscillator (LO) frequency range, for a CATV input frequency band of 50–550 MHz. The isolation between the LO input port and the RF/IF (radio frequency/intermediate frequency) port exceeded 40 dB for greater than 10 dBm LO injection. The third order intercept was better than +20 dBm.

An important consideration in achieving low conversion loss is the on/off times of the diodes and the resulting shape of the mixer switching waveform. A shorter switch-on time, with a fast and clean switching waveform, provides a lower conversion loss. However, a shortened switching time increases the impedance of the mixer and makes stray reactances more critical. In this inventive mixer, the diodes are driven so as to switch simultaneously and also to appear at the LO port in parallel rather than in series. This is accomplished by means of a cross-coupling arrangement at the LO port, which reduces the mixer LO impedance by a factor of four.

A theoretical analysis shows that with a +15 dBm injection and a diode reverse-bias of about 1.5V. per diode, and with full recovery of all undesired products, the VHF or UHF conversion loss of a mixer should be about 3 dB. The measured performance of the inventive mixer was found to be close to theoretical, i.e. in the range of 3.5 to 4.5 dB.

To assure clean, sharp short diode switching transitions, it is necessary to control the magnitude and phase of all harmonics of the LO signal, which in turn requires minimization and control of stray reactances. The invention achieves these desirable features by providing a very compact and symmetrical physical construction of all components, as well as by integrating the mixer diodes in association with shielded lines, the diodes being cross-coupled at the LO side of the mixer so as to appear in parallel to the LO source. In order to control distortion, the switching waveform should not be affected by the RF signal. Therefore an LO-to-RF signal ratio larger than 40 dB should be used. Except for a small ferrite balun between the local oscillator and the inventive mixer, there are no transformers or baluns that would contribute to conversion loss and imbalance.

The result is a new and improved high frequency mixer having an extremely low conversion loss without a countervailing reduction in other performance characteristics. The resulting mixer also combines mechanical geometry and electrical circuitry to provide a low cost, high performance, single-balanced or double-balanced device.

BRIEF DESCRIPTION OF THE DRAWINGS

The invention will be better understood from the attached drawings, in which:

FIG. 1 is a simplified electrical circuit diagram showing a prior art mixer;

FIG. 2 is a schematic rendition of a single-balanced mixer incorporating this invention;

DETAILED DESCRIPTION OF THE PREFERRED EMBODIMENT

Figure 4:
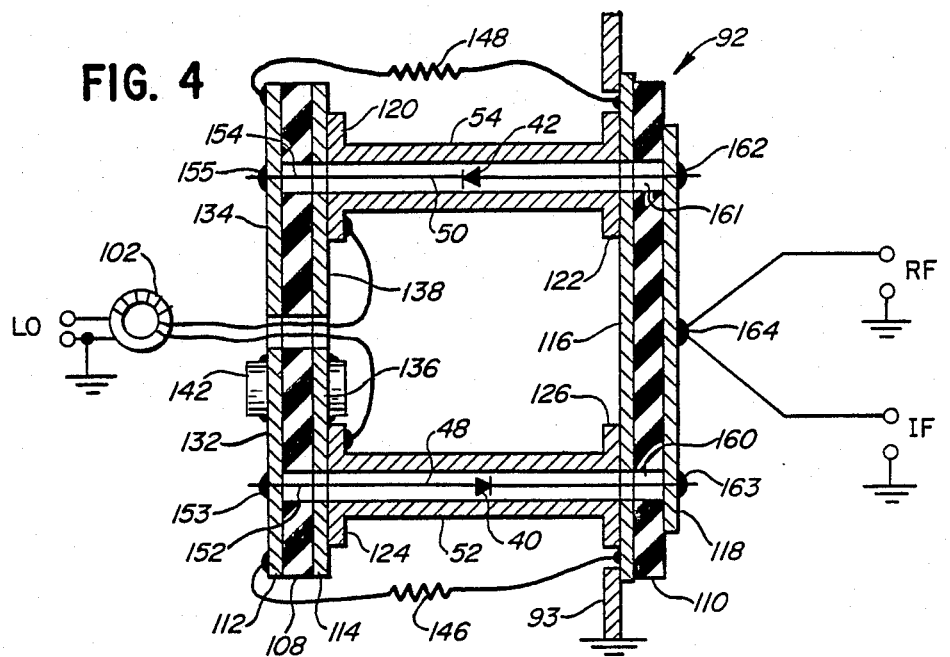
FIG. 4 is a cross-section taken along line 4—4 of FIG. 3 and showing the physical construction of the inventive mixer.

An example of a prior art single-balanced mixer is shown in FIG. 1. The mixer includes an input balun 20 for injecting the local oscillator signal LO from a source 22, and a pair of diodes 24, 26 operated in series in response to the injected LO signal. A combined RF/IF port 28 is connected to a junction between the diodes 24, 26. A second balun 30 is connected between the diodes 24, 26 and ground to provide a ground return path for the RF/IF current conducted by diodes 24, 26.

The diodes 24, 26 are biased to be conductive in series in response to the LO signal. That is, the local oscillator signal LO has a waveform with alternately positive and negative half-cycles. During LO signal half waves of a first polarity, terminal 32 is positive and terminal 34 is negative (as shown in FIG. 1). Both of the diodes 24, 26 are then forward-biased to form a conductive series path across the local oscillator 22. When the LO signal is in the next half cycle, terminals 32, 34 are of the opposite polarity. Both diodes 24, 26 are then back-biased, and neither conducts. This series connection of the two diodes 24, 26 results in the average impedance across the output terminals of the local oscillator being twice the impedance of each individual diode (i.e., 2Z).

As will be shown hereinafter, the diodes in the inventive mixer are effectively connected in parallel, thereby placing an impedance of Z/2 across the output terminals of the local oscillator. This impedance reduction allows for a significant improvement in the LO injection efficiency at high frequencies.

Another inefficiency of the prior art mixer (FIG. 1) results from the use of the second balun 30 to provide an RF/IF ground return path for the diodes 24, 26. Balun 30 dissipates a portion of the RF and IF energy, thereby increasing the conversion loss of the mixer. The inventive mixer eliminates the second balun 30 and therefore reduces the conversion loss.

A single-balanced embodiment of the inventive mixer is shown at 36 in FIG. 2. The mixer 36 includes two diodes 40, 42 and an LO balun 37. The mixer 36 also comprises a pair of coaxial transmission lines 44 and 46, each line having an effective length which is much less than one quarter wavelength at the local oscillator frequency. The transmission lines 44, 46 include center conductors 48 and 50 and, coaxially therewith, outer conductive shields 52 and 54. First diode 40 is connected in series with the center conductor 48 and enclosed within the shield 52, thus forming the first transmission line 44. Second diode 42 is similarly connected in series with the center conductor 50 and enclosed within the shield 54 to form the second transmission line 46. The two center conductors 48, 50 are connected together at junction 38, which comprises the unbalanced RF/IF port of mixer 36. A bandsplit network 58 is connected to junction 38 to separate the RF and IF signals. Also the two shields 52, 54 are connected to a common ground at terminal 60.

At the local oscillator port, a cross-coupling arrangement 62 is employed wherein the first center conductor 48 of first transmission line 44 is coupled to the second shield 54 of second transmission line 46. The second center conductor 50 of second transmission line 54 is coupled to the first shield 52 of first transmission line 44. The LO output from balun 37 is coupled across the shields 52, 54 of the two transmission lines 44, 46 at terminals 70, 72. A capacitor 68 is also coupled across the two shields 52, 54 to compensate the inductive reactance of the shields at the LO center frequency. This provides maximum LO energy for diode switching within the transmission lines.

In operation, assume that the LO signal has the polarity shown in FIG. 2. Due to the cross coupling of center conductors 48, 50 at the LO port, the anode of diode 40 will experience a positive potential and the cathode of diode 42 will experience a negative potential so that both diodes will be forward-biased and will conduct LO current. Moreover, due to the symmetrical construction of mixer 36, the LO voltage applied to the center conductors 48, 50 will divide evenly so that junction 38 will be at virtual ground for the LO signal. The virtual ground at junction 38 causes the LO current conducted inside transmission line 44 to be reflected back to the LO port. Similarly, LO current conducted by transmission line 46 is also reflected back to the LO port at junction 38. This provides substantially full isolation between the LO and RF/IF ports.

With respect to the LO signal, the result of the foregoing is to effectively place the two diodes 40, 42 in parallel across the terminals 70, 72 of the balanced LO port. More particularly, the anode of diode 40 is directly connected to terminal 70 of the LO port and the cathode of diode 42 is directly connected to terminal 72 of the LO port. The cathode of the diode 40 is connected to junction 38 (which is at virtual ground) with respect to the LO signal and is therefore effectively connected to shield 52 (which is grounded near junction 38) and thereby to terminal 72. Similarly, the anode of diode 42 is connected to junction 38 and is therefore effectively connected to shield 54 (which is also grounded near junction 38) and thereby to terminal 70. As a result, diodes 40, 42 are effectively connected in parallel across terminals 70, 72 of the LO input port. As explained previously, this presents a reduced impedance to the LO input port allowing for improved LO injection efficiency.

The injected RF signal at junction 38 divides equally between center conductors 48 and 50 and is returned through cross-coupling arrangement 62 by the shields of the opposite transmission lines. Thus, the RF current carried by conductor 50 and diode 42 of transmission line 46 is returned to ground via the cross-coupling arrangement 62 and the inside surface of shield 52 of transmission line 44. The RF current carried by conductor 48 and diode 40 is returned to ground via the cross-coupling arrangement 62 and the inside surface of shield 54 of transmission line 46. The IF signal developed at junction 38 by diodes 40, 42 is similarly returned to ground along the inner surfaces of shields 52, 54 through cross-coupling arrangement 62. This RF/IF ground return path is more efficient than lossy prior art balun 30, the return path being practically lossless and essentially decoupled from the LO port.

Figure 3:
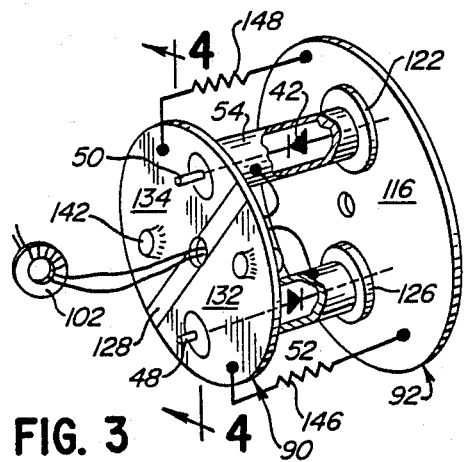
FIG. 3 is a perspective view of the inventive mixer.

FIGS. 3 and 4 illustrate one practical construction of a single-balanced, self-biased implementation of the inventive mixer. The mixer comprises two double-side printed-circuit boards 90, 92, a pair of conductive tubular shields 52, 54, a pair of diodes 40, 42, and a bifilar-wound toroid 102 forming the balun 37. This balun has an unsymmetrical high characteristic impedance with respect to ground for the RF/IF signals and a low (about 50 ohms) symmetrical characteristic impedance for the local oscillator signal. Resistor-capacitor pairs 146, 140 and 148 and 142 are provided for self-biasing. Capacitors 140 and 142 also provide for cross-coupling arrangement 62 as will be explained hereinafter.

The printed circuit boards 90, 92 comprise conventional insulating supporting boards 108, 110 having metallic layers 112, 114, 116, 118 on the opposite sides thereof. Metallic layer 116 of printed-circuit board 92 is connected to ground plane 93. On the opposite ends of tubular shields 52, 54, flanges 120, 122, 124, 126 are electrically joined to confronting metallic faces 114, 116 of the printed circuit boards 90, 92. By comparing FIGS. 2, 3 and 4 along with the reference numerals thereon, it will be apparent how the physical structure relates to the circuit diagram.

Figures 5A, 5B:
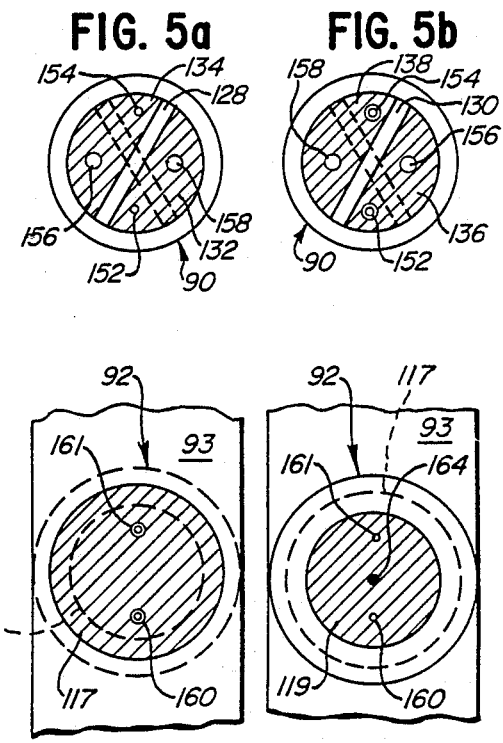
FIG. 5a is a plan view of the outside surface of the left-hand end plate of FIG. 3.
FIG. 5b is a plan view of the inside surface of the left-hand end plate of FIG. 3.

The opposite sides 112, 114 of printed circuit board 90 comprise circular discs (see FIGS. 5a and 5b) with the conductive material etched on opposite sides to form diagonal separations at 128, 130 on each side of the insulator board, thereby forming generally semicircular plates 132, 134 on one side and 136, 138 on the opposite side. It should be noted that the diagonal separations 128, 130 are angularly offset from each other as best seen in FIGS. 5a, 5b. Center conductor 48 extends through an aperture 152 in board 90 and is electrically connected to semicircular disc 132 at 153. Center conductor 50 extends through an aperture 154 in board 90 and is electrically connected to semicircular disc 134 at 155. Capacitor 140 is located within an aperture 158 in board 90 so as to capacitively couple semicircular plates 132 and 138 and capacitor 142 is located within another aperture 156 in board 90 so as to capacitively couple semicircular plates 134 and 136. Cross-coupling arrangement 62 is consequently realized by the connection of center conductor 48 to plate 132 which is coupled to shield 54 by capacitor 140 and plate 138. Similarly, center conductor 50 is coupled to shield 52 through plate 134, capacitor 142 and plate 136. The overlapping sections of plates 134, 136 and 132, 138 therefore serve as pads for effective high frequency cross-coupling between the center conductors and shields.

It will also be seen that there is a capacitive coupling between semicircular plate 132 on one side of board 90 and the semicircular plate 136 on the opposite side of the board. There is a similar but complementary coupling between semicircular plates 134 and 138. Due to the cross-coupling provided by capacitors 140 and 142, and the short electrical path presented thereby, the overlapping discs 134, 138 and 132, 136 effectively form a pair of parallel capacitances connected across shields 52 and 54 at the LO port thereby implementing capacitor 68 of FIG. 2.

Figures 6A, 6B:
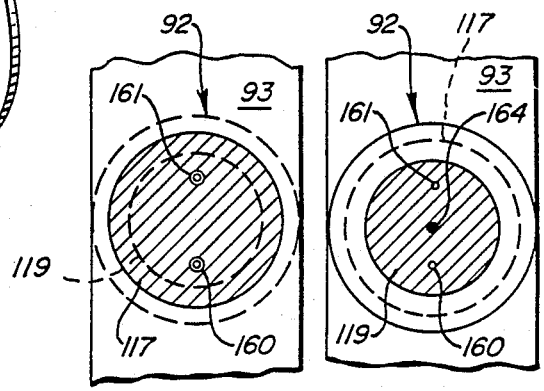
FIG. 6a is a plan view of the inside surface of the right-hand end plate of FIG. 3.
FIG. 6b is a plan view of the outside surface of the right-hand end plate of FIG. 3.

The metallic films 116, 118 on opposite sides of printed circuit board 92 are etched to provide two circular discs 117, 119 (see FIGS. 6a and 6b). The disc 117 has a diameter which is larger than that of disc 119, and which provides a connection to ground plane 93 for electrically interconnecting metal tubes 52, 54 to ground (junction 60 in FIG. 2). The diode leads 48, 50 pass through holes 160, 161 in the printed-circuit board 92. The disc 119 has a center terminal 164 for making a connection to the RF/IF bandsplit network 58. The diode leads 48, 50 are connected to disc 118 at points 163, 162 (FIG. 4).

Figure 7:
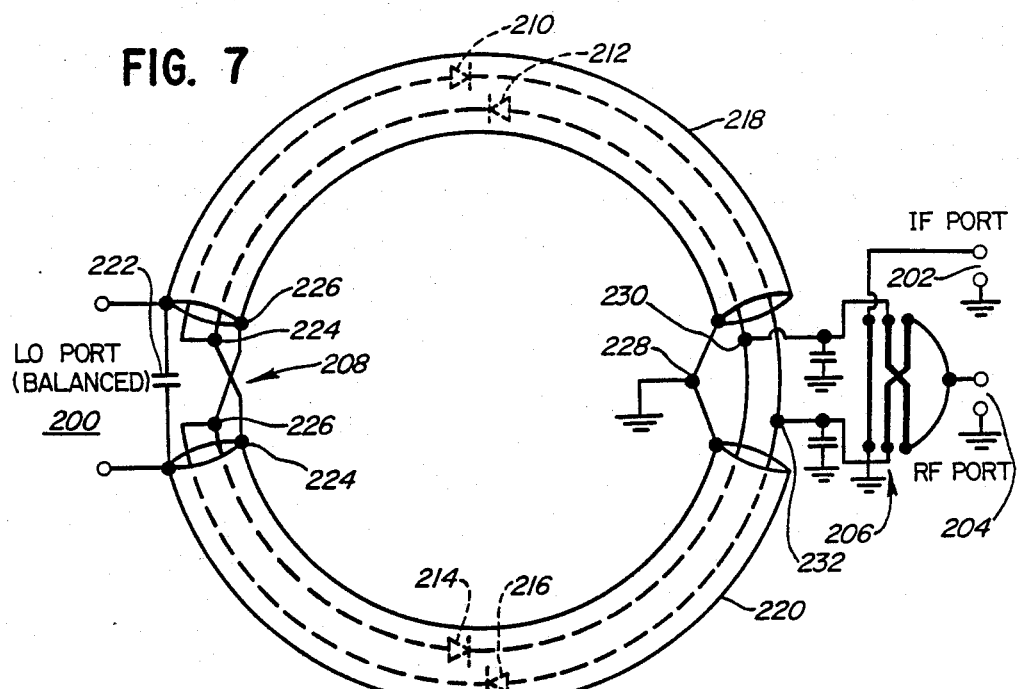
FIG. 7 is a stylized rendition of a double-balanced mixer incorporating the invention.

A second embodiment providing an unbiased double-balanced mixer is shown in FIG. 7. This mixer has a balanced local oscillator port 200, an intermediate frequency (IF) output port 202, and a radio frequency (RF) input port 204. A balun 206 wound with trifilar wire provides a balanced-unbalanced-transformer-like coupling which isolates the RF from the IF port. The cross-coupling at 208 causes all four diodes 210, 212, 214, 216, to appear in parallel at the LO port 200. The capacitor 222 compensates the outer inductance of the shields 218, 220 at the LO center frequency. It will be appreciated that the embodiment of FIG. 7 is a double-balanced version of the mixer of FIG. 2.

Figure 8:
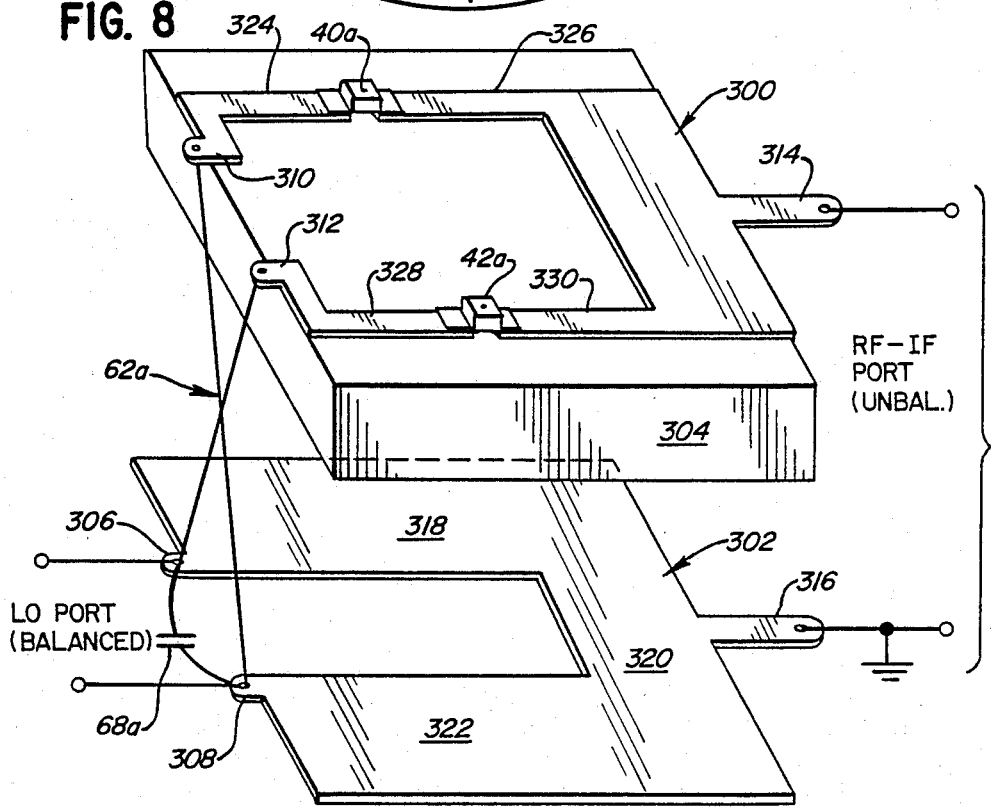
FIG. 8 is a perspective view showing the physical construction of a third embodiment of the invention, which uses a printed circuit board as a diode shield.

A third embodiment of the invention is shown in an exploded view of the physical structure in FIG. 8. While a single-balanced unbiased mixer is shown here, it could also be realized as a double balanced mixer.

In greater detail, the metallic films 300, 302 are on opposite sides of a printed-circuit board 304. Each of these films has been etched to provide suitable terminals 306, 308, 310, 312, 314, 316 to which the required connections may be made. The lower metallic film 318, 320, 322 forms a U-shaped conductor to provide a partial diode shield which is connected to ground potential at terminal 316. This shielding functions similarly to the shielding provided by a co-axial cable or by the tubes 52, 54, 218, 220 of the embodiments of FIGS. 2 and 7. Metallic strips 324, 326, 328, 330 on the upper printed circuit board surface 300 provide the conductors which connect diodes 40a, 42a between the LO terminals 310, 312 and the RF/IF terminal 314. The cross-connection 62a is provided in this embodiment by wires connecting terminals 306-312 and 308-310.

Those who are skilled in the art will readily perceive how to modify the invention. Therefore, the appended claims should be construed to cover all equivalent structures which fall within the true spirit and scope of the invention.

What is claimed is:

1. A mixer having a balanced LO port and an RF/IF port comprising:
    first and second shield means;
    first and second diodes symmetrically and respectively shielded by said first and second shield means and disposed between said LO and RF/IF ports;
    means at said LO port for coupling said first diode with said second shield means and said second diode with said first shield means; and
    means at said RF/IF port for terminating said diodes and said shield means such that said diodes are operatively coupled in parallel across said LO port.

2. The mixer of claim 1 wherein, at said RF/IF port, both of said shield means are coupled to ground potential and said first diode is connected to said second diode for producing a virtual ground therebetween with respect to the LO signal.

3. The mixer of claim 2 wherein said shield means presents an inductive reactance, and further comprising capacitive means at said LO port compensating for said inductive reactance of said shield means.

4. The mixer of claim 2 wherein:
    said mixer comprises a pair of spaced substantially parallel printed-circuit boards, each of said boards including an insulating support with a metallic film on each side thereof;
    said first and second shield means comprise a pair of hollow tubular shields electrically interconnecting inner and confronting metallic films of said printed circuit boards; and
    said first and second diodes are mounted coaxially within said tubular shields.

5. The mixer of claim 4 wherein a first of said printed-circuit boards which is associated with said LO port has said metallic films etched away along diagonal lines extending across each of said sides, thereby dividing the metallic films on each side thereof into two independent metallic regions which are electrically isolated from each other, the diagonal line on one of said sides being angularly offset relative to the diagonal line on the other of said sides whereby each of the metallic regions on one of said sides overlaps both of the metallic regions on the other of said sides in order to provide a film-to-film capacitive coupling across said insulating support.

6. The mixer of claim 5 wherein a second of said insulator boards is associated with said RF/IF port and has said metallic films etched away to form a concentric pair of metallic discs, the disc on an inner side of said second insulating support having an area which is larger than the area of the disc on an outer side of said second insulating support, and means for holding said larger area disc at a ground potential in order to provide shielding, said hollow tubular shields being electrically coupled to said disc having a larger area.

7. The mixer of claim 1 wherein third and fourth diodes are respectively shielded by said first and second shield means, said first and third diodes being oppositely poled within said first shield, said second and fourth diodes being oppositely poled within said second shield, means at said LO port for coupling the cathode of said second diode and the anode of said fourth diode to said first shield and for coupling the anode of said first diode and the cathode of said third diode to said second shield, and means at the RF/IF port for coupling the anode of said second diode to the cathode of said first diode and for coupling the cathode of said fourth diode to the anode of said third diode in order to form two junctions.

8. The mixer of claim 1 wherein said shield means comprises conductive material on a first side of a support board for providing a shield plane underlying said diodes and on a second side of said support board, a pair of spaced parallel strip lines on said second side of said board extending parallel to said conductive material forming said shield plane, and said strip lines forming leads for individually coupling said diodes between said LO port and said RF/IF port.

9. A mixer having a balanced LO port and an RF/IF port comprising:
   first and second shield means;
   first and second diodes symmetrically and respectively shielded by said first and second shield means and disposed between said LO and RF/IF ports;
   means at said LO ports for coupling the anode of said first diode to said second shield means and the cathode of said second diode to said first shield means; and
   means at said RF/IF port for coupling both of said shield means to ground potential and for coupling the cathode of said first diode to the anode of said second diode for producing, with respect to the LO signal, a virtual ground therebetween, whereby said diodes are operatively coupled in parallel across said LO port.

10. A mixer having a balanced LO port and an RF/IF port comprising:
    first and second spaced substantially parallel printed-circuit boards respectively associated with said LO and RF/IF ports, each of said boards including an insulating support with a metallic film on each side thereof;
    first and second hollow tubular shields electrically interconnecting inner and confronting metallic films of said printed circuit boards;
    first and second diodes respectively mounted coaxially with said first and second tubular shields;
    means associated with said first printed circuit board for coupling said first diode with said second tubular shield and said second diode with said first tubular shield; and
    means associated with said second printed circuit board for coupling said tubular shields to ground potential and for coupling said first diode to said second diode for producing, with respect to the LO signal, a virtual ground therebetween.

11. The mixer of claim 10 wherein said first printed circuit board has said metallic films etched away along diagonal lines extending across each of said sides, thereby dividing the metallic films on each side thereof into two electrically isolated regions, the diagonal line on one of said sides being angularly offset relative to the diagonal line on the other of said sides whereby each of the metallic regions on one of said sides overlaps both of the metallic regions on the other of said sides, and including means for coupling said first diode with said second tubular shield and said second diode with said first tubular shield between overlapping regions of said films.

12. A radio frequency mixer comprising a support board, two diodes having electrodes, a first U-shaped strip line of conductive material on one side of said board, the arms of said first U-shaped strip line being interrupted to provide points for electrically connecting to electrodes of respective ones of said two diodes, a terminal formed at the outer end of each of said arms and in the center of the bight of said first U-shaped strip line, a second U-shaped metallic area on the other side of said board, said second U-shaped area being juxtaposed to said first U-shaped strip line and positioned to provide grounded shielding for the first U-shaped strip line, a terminal formed at each of the outer ends and at the bight of said second U-shaped area, a first cross-connection from said terminal at a left arm of said first U-shaped strip line to said terminal at a right arm of said second U-shaped area, a second cross-connection from said terminal at a right arm of said first U-shaped strip line to said terminal at a left arm of said second U-shaped area, and a capacitor coupled between said first and second cross-connections, and a ground connection to said bight terminal on said second U-shaped area.

13. A mixer having a balanced LO port and an RF/IF port comprising:
    first and second transmission line means;
    first and second diodes symmetrically coupled as a part of said first and second transmission line means respectively and disposed between said LO and RF/IF ports;
    means at said LO port for coupling said first diode with said second transmission line means and said second diode with said first transmission line means; and
    means at said RF/IF port for terminating said diodes and said transmission line means such that said diodes are operatively coupled in parallel across said LO port.

14. A mixer having a balanced LO port and an RF/IF port comprising:
    first and second transmission line means, each of said transmission line means having an outer shield means and at least one inner conductor;
    first and second diodes symmetrically coupled in series as a part of at least one of the inner conductors of each said first and second transmission line means respectively;
    means at said LO port for coupling said first diode with said outer shield means of said second transmission line means and said second diode with said outer shield means of said first transmission line means; and
    means at said RF/IF port for terminating said diodes and said outer shield means such that said diodes are operatively coupled in parallel across said LO port.

* * * * *